United States Patent
Wainerdi et al.

(10) Patent No.: US 7,972,905 B2
(45) Date of Patent: Jul. 5, 2011

(54) PACKAGED ELECTRONIC DEVICE HAVING METAL COMPRISING SELF-HEALING DIE ATTACH MATERIAL

(75) Inventors: James C. Wainerdi, Plano, TX (US); John P. Tellkamp, Rockwall, TX (US)

(73) Assignee: Texas Instruments Incorporated, Dallas, TX (US)

( * ) Notice: Subject to any disclaimer, the term of this patent is extended or adjusted under 35 U.S.C. 154(b) by 233 days.

(21) Appl. No.: 12/425,059

(22) Filed: Apr. 16, 2009

(65) Prior Publication Data
US 2010/0264553 A1   Oct. 21, 2010

(51) Int. Cl.
*H01L 21/00* (2006.01)
(52) U.S. Cl. .......... 438/119; 257/783; 257/E23.01
(58) Field of Classification Search .......... 438/119; 257/783, E23.01
See application file for complete search history.

(56) References Cited

U.S. PATENT DOCUMENTS

| | | | |
|---|---|---|---|
| 5,302,456 A * | 4/1994 | Matsui | 428/407 |
| 6,518,330 B2 * | 2/2003 | White et al. | 523/200 |
| 6,531,340 B2 * | 3/2003 | Jiang | 438/118 |
| 7,108,914 B2 | 9/2006 | Skipor et al. | |
| 2004/0234763 A1 * | 11/2004 | Saito | 428/402.2 |

OTHER PUBLICATIONS

Adee, S. "Self Healing Hulls," [online] IEEE Spectrum [retrieved on Dec. 8, 2008], retrieved from the Internet: <http://www.spectrum.ieee.org/print/6913>.

* cited by examiner

*Primary Examiner* — Phat X Cao
(74) *Attorney, Agent, or Firm* — Yingsheng Tung; Wade J. Brady, III; Frederick J. Telecky, Jr.

(57) ABSTRACT

A method of assembling an electronic device and electronic packages therefrom. A die attach adhesive precursor is placed between a top surface of a workpiece and an IC die. The die attach adhesive precursor includes metal particles, a first plurality of first microcapsules having a polymerizable material inside, and a second plurality of second microcapsules having a polymerization agent inside to form a first polymer upon rupture of first and second microcapsules. A force sufficient to rupture at least a portion of the first plurality of first microcapsules and at least a portion of the second plurality of second microcapsules is applied to form a self-healing die attach adhesive wherein the first polymer binds the plurality of metal particles and the remaining microcapsules and secures the IC die to the top surface of the workpiece. The self-healing die attach adhesive generally includes at least 90 vol. % metal.

11 Claims, 1 Drawing Sheet

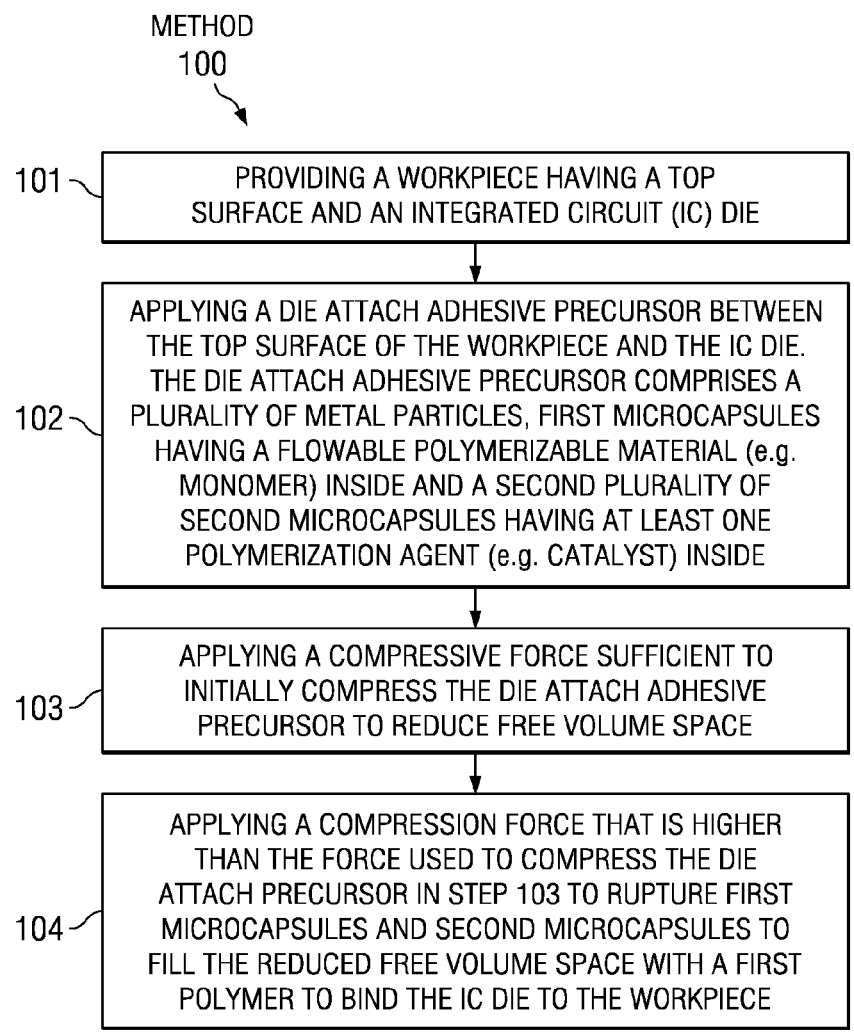
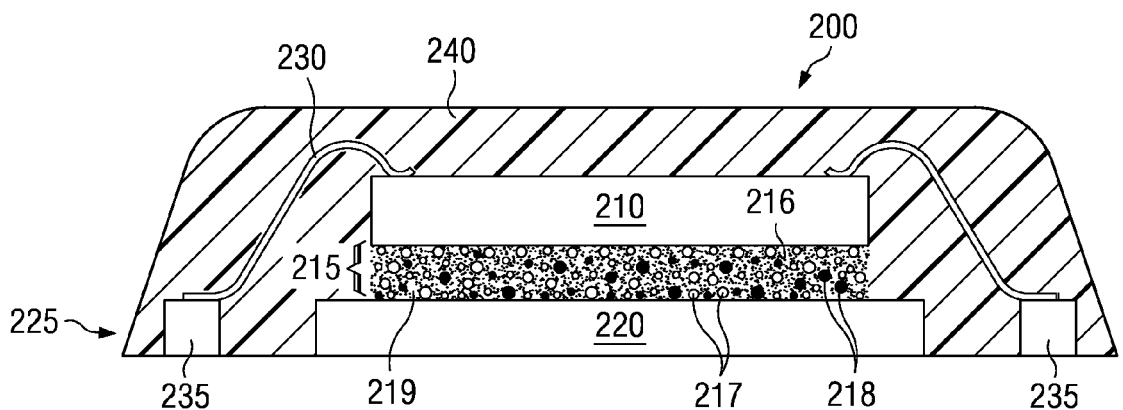

PACKAGED ELECTRONIC DEVICE HAVING METAL COMPRISING SELF-HEALING DIE ATTACH MATERIAL

FIELD OF THE INVENTION

Embodiments of the present invention relate to packaged integrated circuits (IC) devices.

BACKGROUND

Packaged semiconductor devices generally comprise an IC die that is mounted on the die pad of a lead frame using a die attach adhesive. The die attach adhesive provides mechanical attachment, and generally also provides an electrical and/or thermal pathway to the die pad.

The die attach adhesive is generally a polyimide or epoxy based adhesive. Silver is often added in particle flake form as a filler to raise both the electrical and thermal conductivity of the material. The amount of silver is generally limited to about 80% by volume, because a silver content above this limit is well known to result in a loss of strength of the die attach material, and as a result an increase in cracking.

One reliability test for packaged ICs is Moisture Sensitivity Level (MSL) testing, which is used to establish floor life exposure and reflow condition limits for ICs. Although improvements in IC mold compounds and die attach materials have enabled improved MSL classifications at higher temperatures, stress-induced delamination and cracking of the die attach adhesive, which is typically in the thermal path under the IC die, is generally the leading package related failure for MSL testing. Delamination along surface breaking features is also known to be a reliability problem. Being unrepairable, delamination and cracking can lower package yield, and can also lead to field (e.g. reliability) failures.

One self-healing polymer composition is known for use as a die attach adhesive, such as for mounting IC die on a printed circuit board (PCB). In this known arrangement, the self-healing monomer and catalyst microspheres are disposed in a polymer matrix, along with optional metal particles. Although such self-healing die attach adhesives may reduce delamination of the die attach adhesive somewhat, such die attach adhesives have the same silver (or other metal) content restriction described above (<80 vol. %) that is required to maintain the required strength of the die attach material, which thus limits the obtainable electrical and thermal conductivity of the die attach adhesive.

SUMMARY

As described above, known die attach adhesives including the known self-healing die attach adhesive have a limitation on the maximum silver or other metal particle content to about 80 vol. %, and thus the obtainable electrical and thermal conductivity is limited. Embodiments of the invention provide die attach via the rupture of adhesive monomer and catalyst containing microcapsules after initial compression of a metal powder comprising a plurality of filler metal particles. Die attach adhesives according to embodiments of the invention generally have ≧90 vol. % metal, and generally up to about 99 vol. % metal, such as silver.

In conventional die attach materials, the adhesive fills the free space volume between the metal particles when the material is "at rest" (i.e. uncompressed) to maintain a uniform distribution. Being uncompressed, the free space volume % is generally a significant % of the total volume. Being formed from a liquid resin (monomer), there is difficulty in obtaining a uniform polymer distribution which generally leads to significant polymer segregation which results in a need for conventional die attach materials to include even more % polymer.

The polymer adhesive amount required for die attach materials according to embodiments of the invention is significantly less than known die attach materials, which allows significantly higher metal content, for several reasons. The adhesive only needs to occupy the free space between the metal particles, which is generally reduced by compression before the resin emerges. When force is applied to the die attach adhesive precursor comprising microcapsules and metal particles, such as compression under pressure from the IC die, the metal particles are in metal to metal contact with each other, and begin to deform, reducing the free space. With further compression, some of the microcapsules fracture and only then begin to fill the free space between the metal particles with the resin and catalyst from the fractured microcapsules. Because the free space of the deformed (compressed) metal particles is less than the free space of the metal particles before compression, substantially less resin (monomer) is needed.

Moreover, when die attach precursors according to embodiments of the invention are used, the resin is inside microcapsules become more uniformly distributed because the microcapsules are not a liquid, rather they are a distribution of microcapsules with other microcapsules and metal particles. Another advantage of die attach materials according to embodiments of the invention is that there is generally higher metal to metal contact area due to the elastic deformation of the metal filler particles before the resin is liberated.

Having significantly more metal content, die attach materials according to embodiments of the invention provide higher electrical and thermal conductivity as compared to known die attach adhesives, including the known self-healing die attach adhesive described above. Higher electrical conductivity provides better circuit performance for certain ICs by providing a better (lower resistance path to) ground, and the higher thermal conductivity provided improves heat transfer by die attach adhesive which results in a lower die attach temperature reached during circuit operation. The lower die attach temperature during operation is desirable for both electrical performance and reliability. The reduced polymer volume affords reduced moisture absorption, and therefore generally improved MSL performance. Embodiments of the invention thus generally improve package yield, and also lead to a significant reduction in field failures.

Embodiments of the present invention include methods of assembling electronic devices and packaged electronic devices therefrom. A workpiece is provided, such as a die pad of lead frame or PCB having a top surface, as well as an IC die. A die attach adhesive precursor is introduced between the top surface of the workpiece and the IC die. The die attach adhesive precursor comprises a plurality of metal particles, generally in powdered metal form, and a first plurality of first microcapsules having a flowable polymerizable material inside and a second plurality of second microcapsules having at least one polymerization agent inside. The polymerization agent is effective for inducing polymerization of the flowable polymerizable material to form a first polymer upon rupture of the first and second microcapsules. A force sufficient to rupture at least a portion of the first plurality of first microcapsules and at least a portion of the second plurality of second microcapsules is applied to form a die attach adhesive comprising the first polymer which binds the plurality of metal particles, wherein the die attach adhesive secures the IC die to the top surface of the workpiece.

BRIEF DESCRIPTION OF THE DRAWINGS

FIG. 1 shows steps in an exemplary method of assembling an electronic device including compressing a die attach adhesive precursor, according to an embodiment of the invention.

FIG. 2 is a cross sectional view of an electronic package comprising an IC bound to a workpiece shown as a die pad by a self-healing die attach adhesive, according to an embodiment of the invention.

DETAILED DESCRIPTION

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 shows steps in an exemplary method 100 of assembling an electronic device including a self-healing die attach adhesive, according to an embodiment of the invention. Step 101 comprises providing a workpiece having a top surface, and an integrated circuit (IC) die. The workpiece can comprise the die pad of a lead frame or a printed circuit board (PCB).

Step 102 comprises applying a die attach adhesive precursor between the top surface of the workpiece and the IC die. The die attach adhesive precursor comprises a plurality of metal particles (e.g. a powdered metal, such as a plurality of metal flakes), a first plurality of first microcapsules having a flowable polymerizable material (e.g. monomer) inside, and a second plurality of second microcapsules having at least one polymerization agent (e.g. catalyst) inside for inducing polymerization of the flowable polymerizable material to form a first polymer upon rupture of the first and second microcapsules.

Control and generally limitation of the metal particle (e.g. powder) free space can be accomplished by selection of the metal particle size, shape and distribution which establishes initial contact. The metal particles can comprise a variety of different metal compositions, shapes, and sizes. Exemplary compositions include aluminum, silver, copper, titanium, tungsten, tin and nickel/titanium alloys (e.g. memory metal), related alloys and combinations thereof. Exemplary particle shapes can be selected from spheres, and anisotropic shapes such as flakes and rods. Anisotropic shapes such as flakes and rods have been found by the Present Inventors to generally provide better packing following compression processing (e.g. less free space), as compared to spheres. For example, silver flakes will deform under low stress, thus improving electrical and thermal conductivity. However, spherical particles can also provide high density (low free space) if the composition has a sufficiently low elastic modulus (e.g. $\leq 100$ GPa), and high elongation to allow deformation to occur prior to release of the monomer and catalyst. Lead, gold, silver, aluminum and memory metal heat-treated to obtain the superelastic properties are examples of metals with these properties, and can generally provide low free space due to high deformation at low stress levels. The particles size range is generally <1 µm to 25 µm.

The microcapsules are hollow and may be spherically shaped, such as hollow microspheres, microbubbles or microballoons, and have solid walls that enclose the liquid material inside. In general, the microcapsules may have an average external diameter less than about 25 micrometers, and the average size may range anywhere from about 1 to about 25 micrometers. The thickness of the shells or walls of the microcapsules are selected to be sufficient for the application in order to essentially preclude premature rupture of the microcapsules under normally encountered compressive or tensile forces that are less than those consistent with dispensing. The thickness of the microcapsules, for example, can be <1 to 3 micrometers in some commercially available products. The outermost walls of the microcapsules can be formed, for example, of hydrous metal oxide, silica, borosilicates; silicate type sol-gel precursors, carbon, or polymers such as urea-formaldehyde, and phenolics.

The flowable polymerizable material can comprise a variety of different materials, such as suitable monomers, oligomers, or combinations thereof. In addition, small amounts of solvents may be incorporated to facilitate the material flow flowing microcapsule rupture. The flowable polymerizable material generally has viscosity and rheological characteristics that permit it to flow during compression processing at assembly and at the expected operating temperature in which the electronic device is used. A solvent can be included inside the microcapsule together (e.g., physically mixed) with the polymerizable material in an amount effective to facilitate the flow of the polymerizable material upon rupture of the microcapsule. When used, the solvent generally is selected to be a liquid or flowable material at the temperature at which the self-healing polymer composition is designed to be used. The solvent, when used, is generally chemically inert relative to the polymerizable material, and the polymerization agent.

Exemplary flowable polymerizable material include monomer resins, for example, for forming epoxies, urethanes, silicones, polyimides, polyesters, organosilicon polymers. These resins typically will be curable resins that are dielectric, moisture resistant, and adhesive. The polymerization agent (e.g. catalyst) is generally selected based on the monomer selected. The die attach adhesive precursor applying step can comprise syringe screen printing, spraying, or fluidized bed application methods and may incorporate the use of a solvent to aid in patterning and dispensing.

In step 103, a compressive force sufficient to initially compress the die attach adhesive precursor is applied. When such force is applied to the die attach adhesive precursor comprising microcapsules and the metal particles (e.g., powder), the metal particles are deformed first and as a result the free space between the metal particles is reduced. Force can be applied though a number of means, such as compression under pressure from the IC die, or ultrasonic. Because the free space of the deformed and compressed metal particles is less than the free space of the metal particles before compression, substantially less resin (monomer) is needed in the compressed state as compared to the uncompressed state, which allows the self-healing die attach adhesive formed after step 104 described below to have a higher metal content (e.g., >90 vol. %).

Step 104 comprises applying a compression force that is higher than the force used to compress the die attach precursor in step 103. Such a higher force ruptures at least a portion of the first plurality of first microcapsules and at least a portion of the second plurality of second microcapsules to release flowable polymerizable material and polymerization agent (e.g. catalyst) to fill the free space of the compressed metal particles with a first polymer to form a self-healing die attach adhesive. The first polymer binds the plurality of metal particles and the remaining microcapsules, wherein the self-healing die attach adhesive secures the IC die to the top surface of the workpiece. The remaining microcapsules provide the self-healing function, and generally collectively comprise at least 1 vol. % to 5 vol. % of the self-healing die attach adhesive. As described above, the self-healing die attach adhesives according to embodiments of the invention generally have $\geq$90 vol. % metal, such as 95 vol. %, and generally up to about 99 vol. % metal. Although step 103 and 104 are described herein as separate steps, they can be combined in a single step where the applied compressive force increases as a function of time to first compress the metal particles and later reach the higher force sufficient to rupture at least a portion of the first plurality of first microcapsules and at least a portion of the second plurality of second microcapsules to induce polymerization and bonding.

As described above, typically, processing conditions are selected so that at least some of the microcapsules remain unfractured in the die attach adhesive so that the self-healing function is provided for the assembled electronic device. The presence of a sufficient concentration of first and second microcapsules in the die attach adhesive provides the self-healing feature to the die attach adhesive since significant stress to the die attach adhesive will cause rupture of first and second microcapsules which generates polymer that fills emerging cracks in the die attach adhesive or adds polymer to resist delamination along surface breaking features, thus making cracking and delamination repairable in-situ.

In a typical embodiment, the polymeric portion of said die attach adhesive consists of exclusively the first polymer, which is provided by polymerization of the flowable polymerizable material (e.g. monomer) during step 104. In such an embodiment, the die attach adhesive includes only a single polymer composition.

FIG. 2 illustrates a cross sectional depiction of an embodiment of the present invention comprising an electronic package 200 comprising an IC 210 bound to a workpiece shown as a die pad 220 by a self-healing die attach adhesive 215. Lead frame 225 provides the die pad 220 and lead pins 235 shown. Bond wires 230 are shown coupling locations on the topside of the IC die 210 (e.g. bond pads) to the lead pins 235. An encapsulant 240 is shown for encapsulating the IC die 210 and bond wires 230.

The self-healing die attach adhesive 215 comprises a plurality of metal particles 216, such as rod or flake shaped particles, and a first plurality of first microcapsules 217 having a flowable polymerizable material inside and a second plurality of second microcapsules 218 having at least one polymerization agent inside effective for inducing polymerization of the flowable polymerizable material to form a first polymer 219 upon rupture of the first 217 and second microcapsules 218. The first polymer 219 holds together components of the self-healing die attach adhesive 215 comprising metal particles 216, first microcapsules 217 and second microcapsules 218. During assembly, as described above, using a die attach precursor according to an embodiment of the invention interposed between the IC die 210 and the die pad 220, in a typical embodiment an applied force compresses the die attach precursor to reduce free space between the metal particles. The applied force then ruptures a portion, but not all, of the first plurality of first microcapsules and a portion of the second plurality of second microcapsules to form the first polymer 219 that binds together the respective components in the die attach adhesive 215 shown in FIG. 2.

As known in the art, the bond wires 230 can comprise metals such as Au, Cu, Sn-plated Cu or Al. Although not shown, IC die 210 can have through silicon via (TSV) connections for ground connections, I/O signal connections and/or power supply connections. Moreover, although not shown, IC die 210 can also be flip-chip bonded. Moreover, although the self-healing die attach adhesive 215 is shown occupying the full distance between the IC die 210 and the die pad 220, in some embodiments the self-healing die attach adhesive 215 occupies only a portion of such distance. Optionally, the encapsulant 240 can comprise a self-healing composition according to embodiments of the invention. Such compositions may also be used for top side die contact where high electrical & thermal conductivity is an advantage. An example is the Power Clip QFN (Q5) package available from Psi Technologies Holdings Incorporated, Taguig, Metro Manila.

Self-healing die attach materials according to embodiments of the invention are expected to find a wide range of applications due to the high electrical conductivity and high thermal conductivity provided by the very high metal content provided (e.g. >90 vol. % metal), as well as the self-healing properties provided. The 25° C. electrical conductivity is generally below 100 $\mu\Omega$·cm at a Bond Line thickness (BLT) of below 25 $\mu$m. The 25° C. thermal conductivity generally has the same trend as electrical conductivity. Measurement values are dependant on measurement method, with W/m K values significantly greater than 20, and $\theta$Jp (junction to pad temperature differential) of less than 1° C./watt being generally achievable, such as <0.5° C./watt.

EXAMPLES

Embodiments of the present invention are further illustrated by the following specific Example, which should not be construed as limiting the scope or content of embodiments of the invention in any way. A 48PHP package (7×7×1 mm HTQFP) with a 25 $\mu$m BLT, compacted to a metal density of ~95% can be expected to have $\theta$Jp values of between 0.5 and 0.3° C./watt with embodiments of the invention, whereas values of between 1.6 and 0.7° C./watt are generally achieved by conventional die attach materials. The metal composition for this example was silver flakes and lead/5% tin balls.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A method of assembling an electronic device, comprising:
   providing a workpiece having a top surface, and an integrated circuit (IC) die;
   applying a die attach adhesive precursor between said top surface of said workpiece and said IC die, said die attach adhesive precursor comprising:
     a plurality of metal particles;
     a first plurality of first microcapsules having a flowable polymerizable material inside; and
     a second plurality of second microcapsules having at least one polymerization agent inside effective for inducing polymerization of said flowable polymerizable material to form a first polymer upon rupture of said first and second microcapsules, and
   applying a force sufficient to rupture at least a portion of said first plurality of first microcapsules and at least a portion of said second plurality of second microcapsules to form a die attach adhesive comprising said first polymer binding said plurality of metal particles, said die attach adhesive securing said IC die to said top surface of said workpiece.

2. The method of claim 1, wherein said workpiece comprises a die pad of a lead frame.

3. The method of claim 1, wherein said applying said die attach adhesive precursor comprises application using at least one syringe.

4. The method of claim 1, wherein said die attach adhesive comprises at least 1 vol. % of said first plurality of first microcapsules and at least some of said second plurality of second microcapsules, whereby said die attach adhesive comprises a self-healing die attach adhesive.

5. The method of claim 1, wherein said applying said force comprises ultrasonic treatment.

6. The method of claim 1, said applying said force comprises applying a compressive force between said IC die and said top surface of said workpiece.

7. The method of claim 1, wherein said plurality of metal particles comprises primarily anisotropic shaped particles.

8. The method of claim 1, wherein said plurality of metal particles comprise a high elasticity composition.

9. The method of claim 1, wherein said die attach adhesive comprises at least 90 vol. % metal comprising said plurality of metal particles.

10. The method of claim 1, wherein said die attach adhesive comprises at least 95 vol. % metal comprising of said plurality of metal particles.

11. The method of claim 1, wherein a polymeric portion of said die attach adhesive consists of said first polymer.

* * * * *